(12) United States Patent
Querbach et al.

(10) Patent No.: US 10,242,717 B2
(45) Date of Patent: *Mar. 26, 2019

(54) EXTENDED PLATFORM WITH ADDITIONAL MEMORY MODULE SLOTS PER CPU SOCKET

(71) Applicant: INTEL CORPORATION, Santa Clara, CA (US)

(72) Inventors: Bruce Querbach, Hillsboro, OR (US); Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/808,390

(22) Filed: Nov. 9, 2017

(65) Prior Publication Data

US 2018/0130505 A1    May 10, 2018

Related U.S. Application Data

(63) Continuation of application No. 15/283,167, filed on Sep. 30, 2016, now Pat. No. 9,818,457.

(51) Int. Cl.
| | |
|---|---|
| *G11C 8/00* | (2006.01) |
| *G11C 5/06* | (2006.01) |
| *G06F 1/18* | (2006.01) |
| *H01R 12/71* | (2011.01) |
| *H05K 1/18* | (2006.01) |

(Continued)

(52) U.S. Cl.
CPC .................. *G11C 5/06* (2013.01); *G06F 1/18* (2013.01); *G11C 5/04* (2013.01); *G11C 5/063* (2013.01); *G11C 5/066* (2013.01); *H01R 12/716* (2013.01); *H05K 1/141* (2013.01); *H05K 1/181* (2013.01); *H05K 1/0295* (2013.01); *H05K 2201/09409* (2013.01); *H05K 2201/10159* (2013.01)

(58) Field of Classification Search
CPC ........... G11C 5/06; G06F 1/18; H01R 12/716; H05K 1/181
USPC .............................. 365/230.03, 63; 324/755
See application file for complete search history.

(56) References Cited

U.S. PATENT DOCUMENTS

| | | | |
|---|---|---|---|
| 4,656,605 | A | 4/1987 | Clayton |
| 5,513,135 | A | 4/1996 | Dell et al. |

(Continued)

OTHER PUBLICATIONS

Intel Corporation, "Density Optimized System with Rich Memory and I/O Features", Product Brief, .COPYRGT. 2016, 5 pp.

(Continued)

*Primary Examiner* — Vu Le
(74) *Attorney, Agent, or Firm* — Compass IP Law PC

(57) ABSTRACT

Electronic devices and methods including a printed circuit board configured to accept CPUs and memory modules are described. One apparatus includes a printed circuit board that includes a first row of elements including a first CPU positioned between first and second groups of dual in-line memory modules (DIMMs). The printed circuit board also includes a second row of elements including a second CPU positioned between third and fourth groups of DIMMs. The apparatus also includes a third row of elements including a fifth group of DIMMs, wherein the second row of elements is positioned between the first row of elements and the third row of elements. Other embodiments are described and claimed.

22 Claims, 4 Drawing Sheets

(51) Int. Cl.
*G11C 5/04* (2006.01)
*H05K 1/14* (2006.01)
*H05K 1/02* (2006.01)

(56) References Cited

U.S. PATENT DOCUMENTS

| | | | |
|---|---|---|---|
| 6,717,823 B2 | 4/2004 | McCall et al. |
| 6,793,408 B2 | 9/2004 | Levy et al. |
| 7,024,518 B2 | 4/2006 | Halbert et al. |
| 7,127,629 B2 | 10/2006 | Vogt |
| 7,130,229 B2 | 10/2006 | Dahlen et al. |
| 7,143,207 B2 | 11/2006 | Vogt |
| 7,165,153 B2 | 1/2007 | Vogt |
| 7,194,581 B2 | 3/2007 | Vogt |
| 7,200,787 B2 | 4/2007 | Vogt et al. |
| 7,212,423 B2 | 5/2007 | Vogt |
| 7,219,294 B2 | 5/2007 | Vogt |
| 7,243,205 B2 | 7/2007 | Freeman et al. |
| 7,268,020 B2 | 9/2007 | Vogt |
| 7,340,537 B2 | 3/2008 | Vogt |
| 7,343,458 B2 | 3/2008 | Vogt |
| 7,366,931 B2 | 4/2008 | Vogt |
| 7,369,634 B2 | 5/2008 | Panikkar et al. |
| 7,383,399 B2 | 6/2008 | Vogt |
| 7,386,768 B2 | 6/2008 | Vogt et al. |
| 7,395,485 B2 | 7/2008 | Vogt |
| 7,417,883 B2 | 8/2008 | Vogt |
| 7,447,953 B2 | 11/2008 | Vogt |
| 7,464,241 B2 | 12/2008 | Vogt |
| 7,516,349 B2 | 4/2009 | Alexander et al. |
| 7,539,909 B2 | 5/2009 | LeClerg et al. |
| 7,542,322 B2 | 6/2009 | McCall et al. |
| 7,650,558 B2 | 1/2010 | Rosenbluth et al. |
| 7,702,874 B2 | 4/2010 | Vogt |
| 7,827,462 B2 | 11/2010 | Vogt |
| 7,890,811 B2 | 2/2011 | Rothman et al. |
| 8,020,056 B2 | 9/2011 | Vogt et al. |
| 8,086,812 B2 | 12/2011 | Donnelly et al. |
| 8,098,783 B2 | 1/2012 | Panikkar et al. |
| 8,099,687 B2 | 1/2012 | Leddige et al. |
| 8,171,331 B2 | 5/2012 | Vogt |
| 8,612,809 B2 | 12/2013 | Casper et al. |
| 8,914,568 B2 | 12/2014 | Chinnaswamy et al. |
| 9,261,925 B1 | 2/2016 | Palis et al. |
| 9,818,457 B1 | 11/2017 | Querbach et al. |
| 2003/0011391 A1 | 1/2003 | Brunelle et al. |
| 2004/0083196 A1 | 4/2004 | Reasor et al. |
| 2005/0268061 A1 | 12/2005 | Vogt |
| 2006/0004953 A1 | 1/2006 | Vogt |
| 2006/0198114 A1 | 9/2006 | Coutancier et al. |
| 2006/0288132 A1 | 12/2006 | McCall et al. |
| 2008/0055868 A1 | 3/2008 | Peterson et al. |
| 2010/0036997 A1 | 2/2010 | Brewer et al. |
| 2011/0149501 A1 | 6/2011 | Hughes et al. |
| 2012/0001763 A1 | 1/2012 | Billick et al. |
| 2012/0110363 A1 | 5/2012 | Bacchus et al. |
| 2013/0138844 A1 | 5/2013 | Karamcheti et al. |
| 2014/0117552 A1* | 5/2014 | Qian ............ H01L 23/49827 257/762 |
| 2014/0310490 A1 | 10/2014 | Vogt |
| 2015/0199266 A1 | 7/2015 | Franchetti et al. |
| 2016/0378151 A1 | 12/2016 | Querbach et al. |

OTHER PUBLICATIONS

Intel Corporation, "Intel Server Board S2600TP Product Family and Intel Compute Module HNS2600TP Product Family", Technical Product Specification, Revision 1.41, Apr. 2016, 205 pp.
Intel Corporation, "Intel Server Board S2600TP Product Family Configuration Guide and Spares/Accessories List", Revision 2.1, Jan. 2016, 37 pp.
International Search Report and Written Opinion for PCT Patent Application No. PCT/US17/54186, dated Jan. 11, 2018, 10 pages.
U.S. Appl. No. 15/283,186, entitled "Extended Platform With Additional Memory Module Slots Per CPU Socket and Configured for Increased Performance", filed Sep. 30, 2016, 35 pp.
International Search Report and Written Opinion for PCT Patent Application No. PCT/US2017/054190, dated Jan. 15, 2018, 13 pages.
Office Action for U.S. Appl. No. 15/283,186, dated May 31, 2018, 7 pages.

* cited by examiner

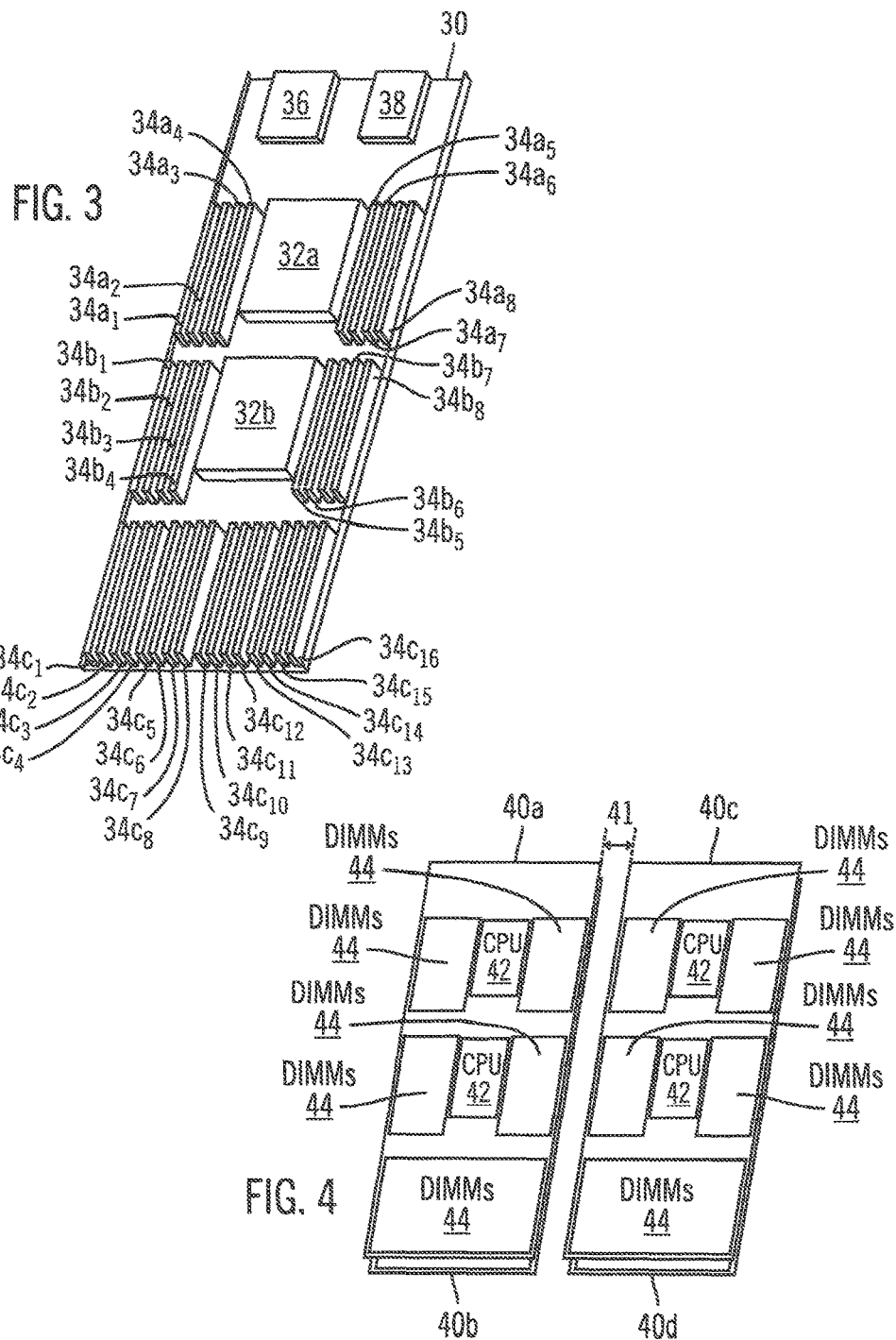

EXTENDED PLATFORM WITH ADDITIONAL MEMORY MODULE SLOTS PER CPU SOCKET

TECHNICAL FIELD

Embodiments related generally to computer platform configurations in electronic devices, including printed circuit boards and elements positioned thereon.

BACKGROUND

Optimization of memory bandwidth is becoming increasingly important in the development of advanced computer platforms. One type of computer platform includes a stacked board configuration with stacked motherboards in a server platform, including an upper board and a lower board. The motherboards may each include two central processing units (CPUs), each positioned in a CPU socket, with the CPUs positioned between groups of multiple memory module slots (also known as sockets) for housing memory such as dual-inline memory modules (DIMMs). Each group of multiple memory module slots may include up to four DIMMs, so that each CPU may be coupled to up to eight DIMMs. Other features on the motherboard may include conventional features such as fans and input/output connections. The computer platform also includes groups of hard drives positioned in a hard drive bay adjacent to an end of the stacked motherboards.

There is a need in the art for increasing the memory bandwidth to improve computer performance.

BRIEF DESCRIPTION OF THE DRAWINGS

Embodiments are described by way of example, with reference to the accompanying drawings, in which like reference numerals may refer to similar elements.

FIG. 3 illustrates a motherboard with elements including CPUs and DIMMs positioned thereon, in accordance with certain embodiments.

FIG. 4 illustrates a system configuration including two sets of stacked motherboards, in accordance with certain embodiments.

DESCRIPTION OF EMBODIMENTS

Figure 1:
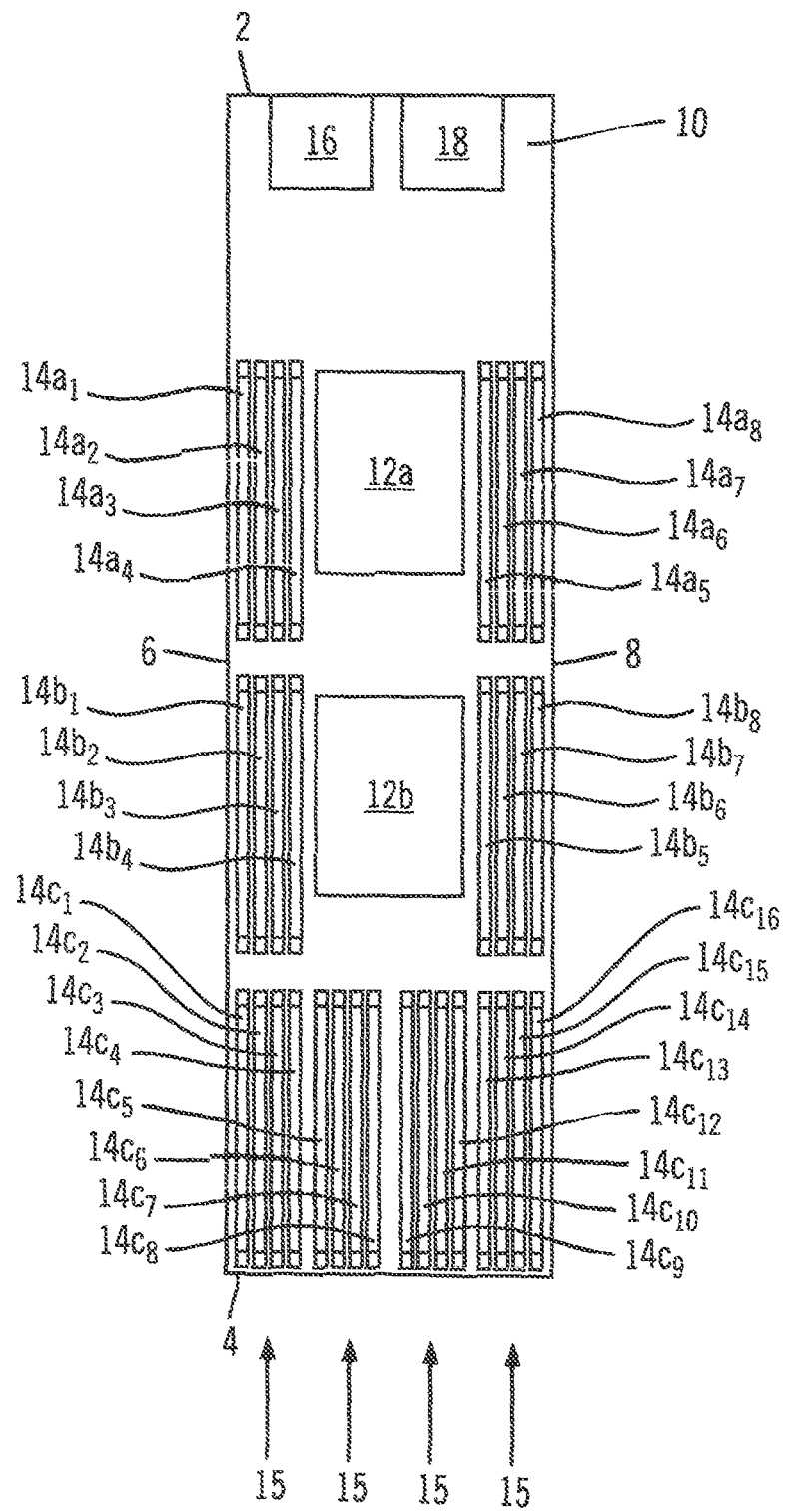
FIG. 1 illustrates a computer platform configuration including a printed circuit board, in accordance with certain embodiments.

The stacked motherboard computer platform configuration discussed in the background above includes a hard drive bay adjacent to an end of the boards. The hard drives positioned in the bay may be sized to be about the same height as that of the two stacked boards (with the CPUs and DIMMs positioned thereon). Certain embodiments utilize a printed circuit board (PCB) such as a motherboard that may extend into what would have been the drive bay in an earlier conventional system. By extending the motherboard, additional memory module slots such as DIMM slots may be positioned on the motherboard and used to provide additional memory bandwidth.

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to platform configurations. Embodiments include both devices and methods.

Certain embodiments relate to computer platforms including a printed circuit board that is configured to include a greater number of memory module slots for accepting memory components such as, for example, DIMMs. The use of greater numbers of DIMMs can lead to greater memory bandwidth and increased performance. Certain embodiments include the use of a board that extends into the position in a computer platform that in conventional systems defines the hard drive bay. Such boards then include a plurality of additional memory module slots for accepting memory components such as, for example, DIMMs. The additional memory slots enable each CPU on the board to utilize more DIMMs and improve memory bandwidth and performance.

Certain embodiments include the use of a PCB such as a motherboard including three rows of elements including a first row comprising a CPU socket positioned between two groups of memory module slots. The motherboard also includes a second row of elements comprising a CPU socket positioned between two groups of memory module slots. The motherboard also includes a third row of elements including a larger group of memory module slots. The third row of elements may include no CPU and may include some memory module slots that are configured to interact with the first row CPU socket and other memory module slots that are configured to interact with the second row CPU socket. CPUs may be inserted into the CPU sockets and memory modules such as DIMMs may be inserted into the memory module slots.

Certain embodiments may utilize memory modules including a variety of DIMMs. In certain embodiments, high speed input/output (HSIO) links (i.e., interconnect, bus, etc.) are used to transmit data from the memory modules to the CPUs.

Certain embodiments relate to apparatus configurations, and certain embodiments relate to process operations.

Reference below will be made to the drawings wherein like structures may be provided with like reference designations. In order to show the structures of various embodiments most clearly, the drawings included herein include diagrammatic representations of certain structures. Thus, the actual appearance of the fabricated structures may appear different while still incorporating the claimed structures of the illustrated embodiments. Moreover, the drawings may show only the structures necessary to understand the illustrated embodiments. Additional structures known in the art may not have not been included to maintain the clarity of the drawings.

FIG. 1 illustrates an embodiment of a printed circuit board (PCB) 10 for use in a computer assembly. The PCB 10 defines a length between an end 2 and an end 4, and defines a width between a side 6 and a side 8. The PCB 10 in FIG. 1 has a length that is greater than the width. The PCB 10 includes first and second central processing unit (CPU) sockets 12a, 12b that are configured to accept a CPU therein.

The PCB 10 also includes a plurality of memory module slots $14a_1$-$14a_8$, $14b_1$-$14b_8$, and $14c_1$-$14c_{16}$. In certain embodiments each of the CPU sockets 12a, 12b may interact with sixteen memory module slots. The PCB 10 configuration illustrated in FIG. 1 includes a first row of elements in a first area of the PCB 10 including memory module slots $14a_1$-$14a_4$ positioned to the left of CPU socket 12a and memory module slots $14a_5$-$14a_8$ positioned to the right of CPU socket 12a, between the side 6 and the side 8. Similarly, a second row of elements in a second area of the PCB 10 includes memory module slots $14b_1$-$14b_4$ positioned to the left of CPU socket 12b and memory module slots $14b_5$-$14b_8$ positioned to the right of CPU socket 12b, between the side 6 and the side 8. A third row of elements in a third area of the PCB 10 includes memory module slots 14c1-14c16, between the side 6 and the side 8. The second row of elements is positioned between the first row of elements and the third row of elements.

CPU socket 12a may be electrically coupled to eight memory module slots, such as memory module slots 14a1-14as positioned in the first row of elements and eight of the memory module slots from the third row of elements (such as memory module slots 14c1-14cs). CPU socket 12b may be similarly electrically coupled to the eight memory module slots 14b1-14bs positioned in the first row of elements and eight of the memory module slots from the third row of elements (such as memory module slots 14c9-14c16).

The PCB 10 may also include locations 16, 18 near an end of the PCB 10 where other features such as external input/output connections may be made. Such input/output connections may include any connections, including, but not limited to, Ethernet connections, USB connections, and video connections. Other types of features, including, but not limited to, board management hardware and routing, may also be present on the PCB 10.

Figure 2:
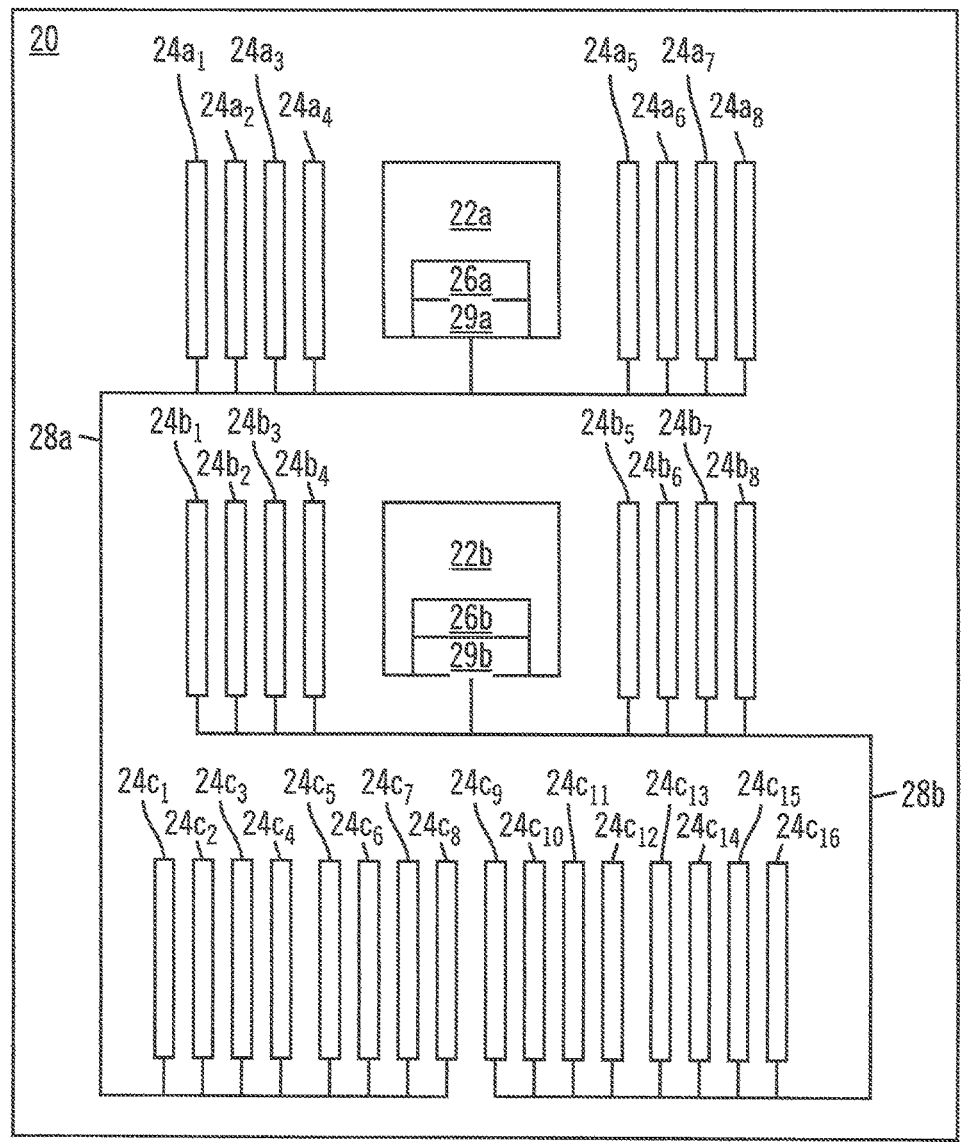
FIG. 2 illustrates CPU and memory module architecture in accordance with certain embodiments.

FIG. 2 illustrates a block diagram illustrating the interaction of first and second CPU's and memory modules (for example, DIMMs) on a PCB 20, similar to the PCB 10 in FIG. 1, in accordance with certain embodiments. As seen in the embodiment illustrated in FIG. 2, the PCB may include three rows of elements, with the first row including a first CPU 22a and a plurality of DIMMs 24a1-24as, a second row of elements including a second CPU 22b and a plurality of DIMMs 24b1-24bs, and a third row of elements including a plurality of DIMMs 24c1-24c16.

DIMMs 24a1-24a16 are coupled to a memory controller 26a through a link 28a, and DIMMs 24b1-24b16 are coupled to a memory controller 26b through a link 28b. The links 28a, 28b may include one or more channels through which data can be delivered. In certain embodiments the memory controllers 26a, 26b may be integral to the CPUs 22a, 22b. The links 28a, 28b may in certain embodiments send data from a DIMM to another DIMM prior to the data reaching the memory controllers 26a, 26b. A daisy chain configuration may be used in certain embodiments. Certain embodiments may also utilize the links 28a, 28b in a manner so that data from a DIMM does not pass through any other DIMMs as it is transmitted to the memory controllers 26a, 26b. It should be appreciated that the electrical connection between the DIMMs and the CPUs may differ from that illustrated in FIG. 2, and may include multiple lanes, each of which can transport data between the memory module(s) and the CPU(s). Moreover, the connections between the DIMMs and the CPUs may be routed through various layers in a three dimensional pathway though the PCB 20 and coupled to the CPU through a plurality of connections including, but not limited to, pin connections and/or ball grid array connections.

As noted above, in certain embodiments the link between the memory modules and the CPUs may be enabled over HSIO links that are capable of multiple gigabit per second per min transfer dates. At the present time HSIO links are capable of at least 5 gigabits per second per pin transfer rate. In certain embodiments a per pin transfer rate of at least 10 gigabits per second is used. Certain embodiments may utilize a per pin transfer rate of about 10 to about 50 gigabits per second. The HSIO links may be communicatively coupled to a CPU through a HSIO interface 29a, 29b that in certain embodiments may be positioned in each of the CPUs 24, 26. The HSIO interface 29a, 29b may be part of or separate from the memory controller 26a, 26b. Examples of HSIO interface technologies include, but are not limited to, PCI-Express interface, a fully buffered DIMM interface, a scalable memory interface (SMI), and a point-to-point interface, such as the QuickPath technology by Intel® and the UltraPath technology by Intel®. In certain embodiments the HSIO link may be a high speed serial interface that includes multiple lanes, each of which can transport data between the memory module and the CPU. A HSIO link may use serial communication where the clock at transmitters and receivers is not synchronous. For example, the clock can be derived from a data stream assuming adequate encoding. HSIO may use differential signaling where a signal+ and a signal- with opposite polarity are sent. This helps to remove common mode noise when only the difference in signal (differential) is sensed at the receiver. HSIO links may use a multi-stage amplifier, and multiple equalization at either or both the transmitter and receiver.

In certain embodiments, the same type of input/output link may be used to couple all memory modules to the CPUs. Likewise, in certain embodiments, the same type of memory module may be positioned in the memory module slots. Embodiments may also include different types of input/output links and/or different types of memory modules in the memory module slots. Such mixing of input/output links and/or memory modules may lead to certain design complexities that are not present when the same type of input/output link and memory module is used for all the memory modules.

Embodiments may utilize a variety of memory types, including, but not limited to a variety of DIMMs (of varying pin sizes and using a variety of technologies, including, but not limited to, volatile memory such as DRAM (dynamic random access memory) technology such as JEDEC DDR4, and non-volatile memory such as byte addressable three dimensional crosspoint memory.

Volatile memory requires power to maintain the state of data stored by the medium. Examples of volatile memory may include, but are not limited to, various types of random access memory (RAM), such as dynamic random access memory (DRAM), and static random access memory (SRAM). A type of DRAM that may be used in memory modules such as DIMMs is synchronous dynamic random access memory (SDRAM). In certain embodiments, DRAM of at least some of the memory modules may comply with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org).

Non-volatile memory does not require power to maintain the state of data stored by the medium. Examples of nonvolatile memory may include, but are not limited to, one or more of: solid state memory (such as planar or 3D NAND flash memory or NOR flash memory), three dimensional crosspoint memory, magnetoresistive random access memory (MRAM), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (FeTRAM) ovonic memory, nanowire memory, electrically erasable programmable read-only memory (EEPROM), other various types of non-volatile random access memories (RAMs), and magnetic storage memory. Certain of the memory types listed above may overlap with other memory types listed.

In certain embodiments, three dimensional crosspoint memory may comprise a transistor-less stackable cross point architecture in which memory cells sit at the intersection of words lines and bit lines and are individually addressable. The architecture may form a three dimensional structure with the memory cells stacked in multiple layers. Bit storage may be based on a change in bulk resistance.

In certain embodiments, one or more memory modules with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org).

Certain embodiments may utilize 16 DIMMs per CPU socket. Certain embodiments may include DIMMs all of the same memory type (for example, all volatile memory including, but not limited to, DDR4, or all non-volatile memory including, but not limited to, three dimensional crosspoint memory), or may include different kinds. In certain embodiments, the DIMMs located farther away from the CPUs may use a HSIO as discussed above due to the distance between the DIMMS and the CPUs. For example, in one embodiment, the DIMMs in FIG. 2 may be configured with DIMMs $24a1$-$24as$ and $24b1$-$24bs$ being DDR4 memory, and DIMMs $24c1$-$24c16$ being three dimensional crosspoint memory. In another embodiment, all the DIMMs may be three dimensional crosspoint memory. In another embodiment, all the DIMMs may be DRAM such as DDR4. Other combinations of DIMM types are also possible.

Unlike conventional DRAM and DDR4 memory technology, DIMMs formed from non-volatile memory technology (for example, three dimensional cross point memory) may be configured to act as both storage and memory. As a result, conventional hard drive technologies and the like (e.g., solid state drive (SSD)) can be removed from the system, opening up space to provide additional DIMM's that provide storage like a hard drive and also provide additional main memory.

As illustrated in FIG. 1, certain embodiments may include the memory module slots (and memory modules such as DIMMs) positioned to extend lengthwise in a parallel manner to one another in all three rows of elements (and substantially parallel to the sides 6, 8), with memory module slots $14a_1$-$14a_4$ and $14a_5$-$14a_8$ extending lengthwise in a parallel manner to each other and also in a parallel manner to memory module slots $14b_1$-$14b_4$, $14b_5$-$14b_8$, and $14c_1$-$14c_{16}$. Furthermore, in certain embodiments, groups of memory module slots may be aligned with each other. For example, as illustrated in FIG. 1, memory module slots $14a_1$-$14a_4$ are aligned in a lengthwise direction with memory module slots $14b_1$-$14b_4$ and memory module slots $14c1$-$14c_4$. Likewise, memory module slots $14a_5$-$14a_8$ are aligned in a lengthwise direction with memory module slots $14b_5$-$14b_8$ and memory module slots $14c_{13}$-$14c_{16}$. In addition, the CPU sockets $12a$ and $12b$ (and CPU's) may be aligned in a lengthwise direction in certain embodiments. Such a configuration with elements aligned permits an efficient flow of air (or other gas) to cool the elements during operation. For example, as illustrated in FIG. 1, air flow 15 may be directed to flow along the lengthwise direction of the third row of elements and then along the lengthwise direction of elements in the second row of elements and the first row of elements. The gaps between the elements permit the air to efficiently flow through the system.

FIG. 3 illustrates an embodiment including a motherboard 30 similar to PCB 10, including CPU and DIMM elements arranged in three rows. The first row includes CPU 32a positioned in a central portion of the motherboard 30, between DIMMs $34a_1$-$34a_4$ and DIMMs $34a_5$-$34a_8$. The second row includes CPU 32b positioned in a central portion of the motherboard 30, between DIMMs $34b_1$-$34b_4$ and DIMMs $34b_5$-$34b_8$. The third row includes DIMMs $34c_1$-$34c_{16}$ with no CPU positioned in the row. Embodiments may include a different number of DIMMs or CPUs in each of the rows than illustrated in FIG. 3. For example, the third row could be configured to include a CPU positioned in a central portion of the motherboard 30, aligned with the CPUs 32a and 32b, with DIMMs positioned to the sides of the CPU in the third row. The motherboard 30 may also include other features such as external input/output connections 36, 38 positioned near an end of the motherboard 30. Such input/output connections may include any connections, including, but not limited to, Ethernet connections, USB connections, and video connections. Other types of features, including, but not limited to, board management hardware and routing, may also be present on the motherboard 30.

In addition, the embodiment of FIG. 3 includes DIMMs and CPUs that are aligned in a lengthwise direction in a similar manner as the memory module slots and CPU sockets in FIG. 1, with the CPUs 32a and 32b aligned along the lengthwise direction of the motherboard 30. The DIMMs $34a_1$-$34a_4$, $34b_1$-$34b_4$, and $34c_1$-$34c_4$ are aligned along a lengthwise direction with one another, as are DIMMs $34a_5$-$34a_8$, $34b_5$-$34b_8$, and $34c_{13}$-$34c_{16}$. In addition, in the embodiment of FIG. 3, all the DIMMs may be parallel to one another.

FIG. 4 illustrates an embodiment of four motherboards 40a, 40b, 40c, and 40d configured with two groups of stacks of two motherboards, which may be utilized, for example, in a computing system. The motherboards 40a-40d may include a similar layout of elements to those described in connection with FIG. 3 above. In certain embodiments, the motherboards 40a-40d may be half-width motherboards, so that they can fit two across and two high in a conventional chassis such as a 2U (two unit) server rack (chassis). The two groups of stacked motherboards 40a, 40b and 40c, 40d may be positioned side by side as in FIG. 4 and may be separated by a gap 41 into which a component such as a power supply may be positioned. Other configurations are also possible. In certain embodiments, the motherboard may have a length of about 26 to about 30 inches, more particularly about 27.5 inches to about 29 inches. Certain embodiments may have a width of about 6 inches to about 9 inches, more particularly, about 6.5 inches to about 7.5 inches.

Figure 5:
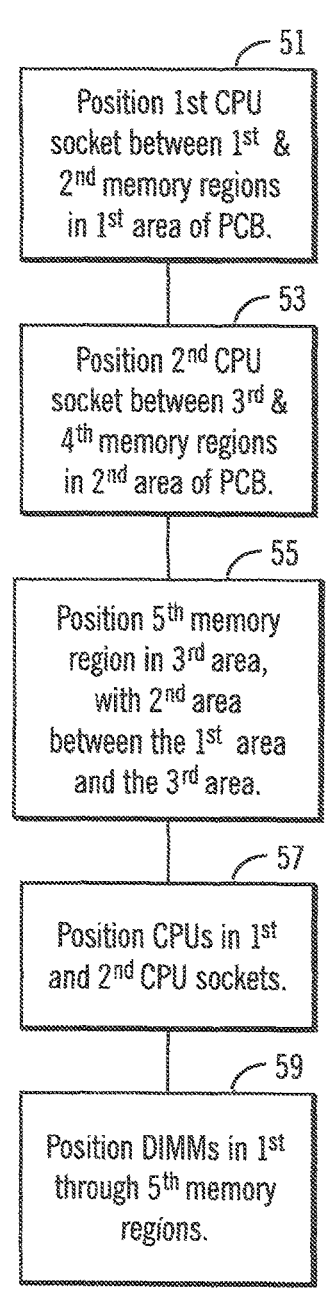
FIG. 5 illustrates a flowchart of operations in accordance with certain embodiments.

FIG. 5 illustrates a flowchart of operations in accordance with certain embodiments including the formation of a PCB for use in computing systems. Box 51 is positioning a first CPU socket between a first memory region and a second memory region in a first area of the PCB. Box 53 is positioning a second CPU socket between a third memory region and a fourth memory region in a second area of the PCB, such as illustrated in FIG. 1. Box 55 is positioning a fifth memory region in a third area, with the second area positioned between the first area and the third area. All of the memory regions may be configured to include memory module slots configured to receive memory modules such as DIMMs. The areas on the PCB are positioned so that the second area is between the first area and the third area. In certain embodiments, the third area may include memory module slots and no CPU socket, as illustrated, for example, in FIG. 1. Such a configuration permits the third area to include more memory module slots than the first area or the second area. Box 57 is positioning a CPU in the first CPU socket and a CPU in the second CPU socket. Box 59 is positioning DIMM modules in the first, second, third, fourth, and fifth memory region. Various embodiments may omit certain operations or add additional and/or modified operations.

Figure 6:
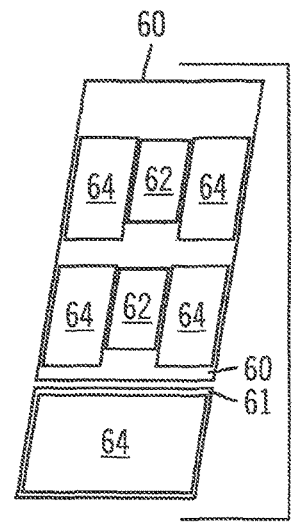
FIG. 6 illustrates a system configuration in accordance with certain embodiments.

For example, in certain embodiments, all three areas are on the PCB. In other embodiments, it is possible that the third area is positioned adjacent to the second area of the PCB on another PCB or other support structure. For example, as illustrated in FIG. 6, a PCB 60 includes two rows of elements thereon, with each row including a region 62 including a CPU in a socket, positioned between regions 64 including DIMMs in memory module slots. A structure 61, which may be another PCB, is positioned adjacent to the PCB 60 and includes a region 64 including DIMMs in memory module slots. The structure 61 may be linked to the PCB 60 using a variety of suitable connections.

Figure 7:
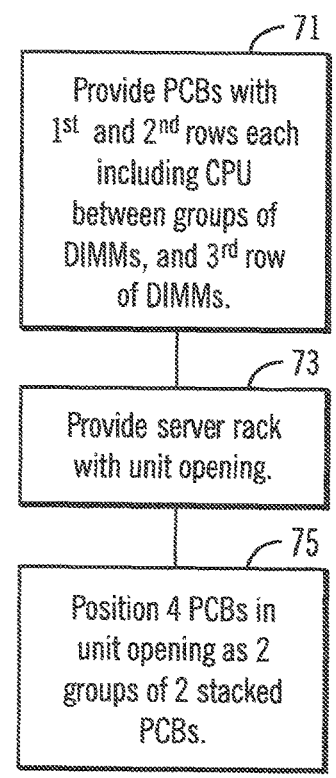
FIG. 7 illustrates a flowchart of operations in accordance with certain embodiments.

FIG. 7 illustrates a flowchart of operations in accordance with certain embodiments for forming computer systems. Box 71 includes providing a plurality of motherboards, each including a first row including a CPU positioned between two groups of DIMMs, a second row including a CPU positioned between two groups of DIMMs, and a third row including DIMMs. The configuration of the motherboards may be similar to those described above. Box 73 includes providing a computing system with an opening for inserting a plurality of PCBs, such as, for example, a server rack with a unit opening. Box 75 includes positioning four PCBs into the opening, as two groups of two stacked motherboards. An example of four PCBs that may be inserted into an opening in a computing system is illustrated in FIG. 4. Various embodiments may omit certain operations or add additional operations to the process.

EXAMPLES

The following examples relate to further embodiments.

Example 1 is an apparatus for receiving memory modules, comprising: a printed circuit board (PCB) including first, second, and third rows of elements; the first row of elements including a first CPU socket configured to receive a first CPU, a first memory region configured to receive at least one memory module, and a second memory region configured to receive at least one memory module, the first CPU socket positioned between the first memory region and the second memory region; the second row of elements including a second CPU socket configured to receive a second CPU, a third memory region configured to receive at least one memory module, and a fourth memory region configured to receive at least one memory module, the second CPU socket positioned between the third memory region and the fourth memory region; and the third row of elements including a fifth memory region configured to receive at least one memory module; wherein the second row of elements is positioned between the first row of elements and the third rows of elements.

In Example 2, the subject matter of any one of Examples 1 and 3-8 can optionally include that each of the memory regions configured to receive at least one memory module includes a plurality of memory module slots.

In Example 3, the subject matter of any one of Examples 1-2 and 4-8 can optionally include that the fifth memory region includes a greater number of memory module slots than the first memory region, the second memory region, the third memory region, or the fourth memory region.

In Example 4, the subject matter of any one of Examples 1-3 and 5-8 can optionally include wherein the first memory region, the second memory region, the third memory region, and the fourth memory region are each configured to accept 4 DIMMs; and wherein the fifth memory region is configured to accept 16 DIMMs.

In Example 5, the subject matter of any one of Examples 1-4 and 6-8 can optionally include wherein any memory slots in each of the first, second, third, fourth, and fifth memory regions extend lengthwise in a direction parallel to one another.

In Example 6, the subject matter of any one of Examples 1-5 and 7-8 can optionally include wherein the printed circuit board comprises a half width motherboard.

In Example 7, the subject matter of any one of Examples 1-6 and 8 can optionally include wherein the printed circuit board includes a high speed input/output (HSIO) link between the fifth memory region and at least one of the first CPU socket and the second CPU socket, the HSIO link including a transfer rate of at least 5 gigabits per second per μm.

In Example 8, the subject matter of any one of Examples 1-7 can optionally include at least one DIMM positioned in each of the memory regions.

Example 9 is a method for configuring a printed circuit board to receive memory modules, comprising: positioning a first CPU socket between first and second memory regions in a first area of a printed circuit board, the first and second memory regions configured to accept memory modules; positioning a second CPU socket between third and fourth memory regions in a second area of the printed circuit board, the third and fourth memory regions configured to accept memory modules; and positioning a fifth memory region in a third area of the printed circuit board, the fifth memory region configured to accept memory modules; wherein the second area of the printed circuit board is positioned between the first area of the printed circuit board and the third area of the printed circuit board.

In Example 10, the subject matter of any one of Examples 9 and 11-14 can optionally include configuring the first, second, third, fourth, and fifth memory regions to include memory module slots, wherein the fifth memory region includes a greater number of memory module slots than the first memory region, the second memory region, the third memory region, or the fourth memory region.

In Example 11, the subject matter of any one of Examples 9-10 and 12-14 can optionally include configuring the memory regions so that: the first memory region, the second memory region, the third memory region, and the fourth memory region are each configured to accept 4 DIMMs; and the fifth memory region is configured to accept 16 DIMMs.

In Example 12, the subject matter of any one of Examples 9-11 and 13-14 can optionally include configuring the first, second, third, fourth, and fifth memory regions to include memory module slots extending lengthwise in a direction parallel to one another.

In Example 13, the subject matter of any one of Examples 9-12 and 14 can optionally include configuring the printed circuit board to include a high speed input/output (HSIO) link between the fifth memory region and at least one of the first CPU socket and the second CPU socket, the HSIO link including a transfer rate of at least 5 gigabits per second perpin.

In Example 14, the subject matter of any one of Examples 9-13 can optionally include positioning at least one DIMM in each of the memory regions.

Example 15 is an apparatus for positioning dual in-line memory modules comprising: a printed circuit board (PCB); a first row of elements on the printed circuit board, including a first CPU positioned between first and second groups of dual in-line memory modules (DIMMs); a second row of elements on the printed circuit board, including a second CPU positioned between third and fourth groups of DIMMs; and a third row of elements, including a fifth group of DIMMs, wherein the second row of elements is positioned between the first row of elements and the third row of elements.

In Example 16, the subject matter of any one of Examples 15 and 17-24 can optionally include wherein the third row of elements includes a greater number of dual in-line memory modules (DIMMs) than the first row of elements, and wherein the third row of elements includes a greater number of DIMMs than the second row of elements.

In Example 17, the subject matter of any one of Examples 15-16 and 18-24 can optionally include wherein the first and second groups of dual in-line memory modules (DIMMs) each include 4 DIMMs; the third and fourth groups of DIMMs each include 4 DIMMs; and the fifth group of DIMMs includes 16 DIMMs.

In Example 18, the subject matter of any one of Examples 15-17 and 19-24 can optionally include wherein the dual in-line memory modules (DIMMs) in each of the first, second, third, fourth, and fifth groups of DIMMs extend lengthwise in a direction parallel to one another.

In Example 19, the subject matter of any one of Examples 15-18 and 20-24 can optionally include wherein the printed circuit board comprises a half width motherboard.

In Example 20, the subject matter of any one of Examples 15-19 and 21-24 can optionally include a first high speed input/output (HSIO) link between the first CPU and a first subgroup of dual in-line memory modules (DIMMs) of the fifth group of DIMMS, the HSIO link including a transfer rate of at least 5 gigabits per second per pin.

In Example 21, the subject matter of any one of Examples 15-20 and 22-24 can optionally include wherein the first, second, and third rows of elements are positioned on the printed circuit board.

In Example 22, the subject matter of any one of Examples 1-21 and 23-27 can optionally include wherein the printed circuit board has a length in a range of 26 to 30 inches and a width in a range of 6 inches to 9 inches.

In Example 23, the subject matter of any one of Examples 1-22 and 24-27 can optionally include wherein the printed circuit board has a length in a range of 27.5 inches to 29 inches.

In Example 24, the subject matter of any one of Examples 15-23 can optionally include a system including the apparatus as in any one of Examples 15-23, wherein the printed circuit board is a first printed circuit board, the system comprising: second, third, and fourth printed circuit boards, each including: a first row of elements on the printed circuit board, including a first CPU positioned between first and second groups of dual in-line memory modules (DIMMs); a second row of elements on the printed circuit board, including a second CPU positioned between third and fourth groups of DIMMs; and a third row of elements, including a fifth group of DIMMs, wherein the second row of elements is positioned between the first row of elements and the third row of elements; a first stack including the first printed circuit board stacked on the second printed circuit board; and a second stack including the third printed circuit board stacked on the fourth printed circuit board; wherein the first stack and the second stack are positioned side by side.

In Example 25, the subject matter of any one of Examples 1-8 can optionally include wherein the PCB defines a length and a width, the length being greater than the width, and wherein the second row of elements is positioned between the first row of elements and the third rows of elements along the length of the PCB.

In Example 26, the subject matter of any one of Examples 9-14 can optionally include wherein the positioning is carried out so that the second area of the printed circuit board is positioned between the first area of the printed circuit board and the third area of the printed circuit board along the length of the PCB.

In Example 27, the subject matter of any one of Examples 15-24 can optionally include wherein the PCB defines a length and a width, the length being greater than the width, and wherein the second row of elements is positioned between the first row of elements and the third row of elements along the length of the PCB.

Example 28 is an apparatus comprising: means for positioning a first CPU socket between first and second memory regions in a first area of a printed circuit board, the first and second memory regions configured to accept memory modules; means for positioning a second CPU socket between third and fourth memory regions in a second area of the printed circuit board, the third and fourth memory regions configured to accept memory modules; and means for positioning a fifth memory region in a third area of the printed circuit board, the fifth memory region configured to accept memory modules; and wherein the second area of the printed circuit board between the first area of the printed circuit board and the third area of the printed circuit board.

Example 29 is an apparatus comprising means to perform a method as described in any preceding Example.

Various features of embodiments described above may be implemented with respect to other embodiments, including both apparatus and method embodiments. Specifics in the examples may be used anywhere in one or more embodiments.

In the foregoing description above, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art. Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting. Embodiments may be manufactured, used, and contained in a variety of positions and orientations.

What is claimed:

1. An apparatus comprising:
a printed circuit board including first, second, and third rows of elements;
the first row of elements including a first central processing unit (CPU) socket configured to receive a first CPU and a first memory region configured to receive at least eight memory modules, the at least eight memory modules of the first memory region to couple with the first CPU via a first group of high speed input/output (HSIO) links;
the second row of elements including a second memory region and a third memory region, the second and third memory regions to separately receive at least eight memory modules, the first CPU socket position between the first and second memory regions, the at least eight memory modules of the second memory region to couple with the first CPU via a second group of HSIO links; and
the third row of elements including a second CPU socket configured to receive a second CPU and a fourth memory region configured to receive at least eight memory modules, the second CPU socket positioned between the third and fourth memory regions, the at least eight memory modules of the third memory region to couple with the second CPU via a third group of HSIO links, the at least eight memory modules of the fourth memory region to couple with the second CPU via a fourth group of HSIO links.

2. The apparatus of claim 1, comprising the first, second, third and fourth groups of HSIO links separately including at least two HSIO links.

3. The apparatus of claim 2, comprising:
the first and the second groups of HSIO links to couple memory modules of respective first and second memory regions with the first CPU through first high speed serial interfaces at the first CPU; and
the third and the fourth groups of HSIO links to couple memory modules of respective third and fourth memory regions with the second CPU through second high speed serial interfaces at the second CPU.

4. The apparatus of claim 2, comprising the first, second, third and fourth groups of HSIO links separately capable of a data transfer rate of at least 50 gigabits per second per pin.

5. The apparatus of claim 1, the first, second, third and fourth memory regions configured to separately receive at least eight memory modules comprises the at least eight memory modules including dual in-line memory modules (DIMMs).

6. The apparatus of claim 5, comprising the DIMMs included in the at least eight memory modules including volatile memory or non-volatile memory.

7. The apparatus of claim 6, the volatile memory comprising dynamic random access memory.

8. The apparatus of claim 6, the non-volatile memory comprising three dimensional crosspoint memory, magnetoresistive random access memory (MRAM), ferroelectric memory, silicon-oxide-nitride-oxide-silicon (SONOS) memory, polymer memory or ferroelecric transistor random access memory (FeTRAM).

9. A method comprising:
positioning a first central processing unit (CPU) socket between first and second memory regions of a printed circuit board, the first and second memory regions configured to separately accept at least eight memory modules;
positioning a second CPU socket between third and fourth memory regions of the printed circuit board, the third and fourth memory regions configured to separately accept at least eight memory modules;
coupling the first CPU socket to the at least eight memory modules of the first and second memory regions via respective first group and second group of high speed input/output (HSIO) links; and
coupling the second CPU socket to the at least eight memory modules of the third and fourth memory regions via respective third group and fourth group of HSIO links.

10. The method of claim 9, comprising the first, second, third and fourth groups of HSIO links separately including at least two HSIO links.

11. The method of claim 10, comprising:
coupling the first and the second groups of HSIO links to memory modules of respective first and second memory regions with the first CPU through first high speed serial interfaces at the first CPU; and
coupling the third and the fourth groups of HSIO links to memory modules of respective third and fourth memory regions with the second CPU through a second high speed serial interfaces at the second CPU.

12. The method of claim 10, comprising the first, second, third and fourth groups of HSIO links separately capable of a data transfer rate of at least 50 gigabits per second per pin.

13. The method of claim 9, the first, second, third and fourth memory regions to separately accept at least eight memory modules comprises the at least eight memory modules accepting dual in-line memory modules (DIMMs).

14. The method of claim 13, comprising the DIMMs included in the at least eight memory modules including volatile memory or non-volatile memory.

15. A system comprising:
a printed circuit board (PCB);
a first row of elements on the printed circuit board, including a first central processing unit (CPU) coupled with a first group of at least eight dual inline memory modules (DIMMs) via a first group of high speed input/output (HSIO) links;
a second row of elements on the printed circuit board, including second and third groups each having at least eight DIMMs, the first CPU position between the first and second groups of DIMMs, the second group of DIMMs coupled with the first CPU via a second group of HSIO links; and
a third row of elements on the printed circuit board, including a second CPU and a fourth group of at least eight DIMMs, the second CPU positioned between the third and fourth groups of DIMMs, the third and fourth groups of DIMMs coupled with the second CPU via respective third and fourth groups of HSIO links.

16. The system of claim 15, comprising the first, second, third and fourth groups of HSIO links separately including at least two HSIO links.

17. The system of claim 15, wherein:
the first and the second groups of HSIO links to couple memory modules of respective first and second memory regions with the first CPU through first high speed serial interfaces at the first CPU; and
the third and the fourth groups of HSIO links to couple memory modules of respective third and fourth memory regions with the second CPU through second high speed serial interfaces at the second CPU.

18. The system of claim 15, comprising the first, second, third and fourth groups of HSIO links separately capable of a data transfer rate of at least 50 gigabits per second per pin.

19. The system of claim 15, comprising the first, second, third and fourth groups of DIMMs including volatile memory that includes dynamic random access memory.

20. The system of claim 15, comprising the first, second, third and fourth groups of DIMMs including volatile memory and non-volatile memory.

21. The system of claim 20, the volatile memory comprising dynamic random access memory.

22. The system of claim 20, the non-volatile memory comprising three dimensional crosspoint memory, magnetoresistive random access memory (MRAM), ferroelectric memory, silicon-oxide-nitride-oxide-silicon (SONOS) memory, polymer memory or ferroelecric transistor random access memory (FeTRAM).

* * * * *